(12) United States Patent
Shi

(10) Patent No.: US 10,606,388 B2
(45) Date of Patent: Mar. 31, 2020

(54) ARRAY SUBSTRATE, MANUFACTURING METHOD THEREOF AND TOUCH DISPLAY PANEL

(71) Applicant: Wuhan China Star Optoelectronics Technology Co., Ltd., Wuhan, Hubei (CN)

(72) Inventor: Tengteng Shi, Guangdong (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 85 days.

(21) Appl. No.: 15/744,788

(22) PCT Filed: Dec. 18, 2017

(86) PCT No.: PCT/CN2017/116962
§ 371 (c)(1),
(2) Date: Jan. 13, 2018

(87) PCT Pub. No.: WO2019/061874
PCT Pub. Date: Apr. 4, 2019

(65) Prior Publication Data
US 2019/0102012 A1    Apr. 4, 2019

(30) Foreign Application Priority Data

Sep. 30, 2017  (CN) .......................... 2017 1 0937227

(51) Int. Cl.
*G06F 3/041* (2006.01)
*G06F 3/047* (2006.01)
(Continued)

(52) U.S. Cl.
CPC .......... *G06F 3/0412* (2013.01); *G02F 1/1343* (2013.01); *G02F 1/133345* (2013.01);
(Continued)

(58) Field of Classification Search
None
See application file for complete search history.

(56) References Cited

U.S. PATENT DOCUMENTS

2018/0181240 A1*  6/2018  Heo ....................... G06F 3/0412

FOREIGN PATENT DOCUMENTS

CN          103353818 A          10/2013
CN          103809809 A           5/2014
(Continued)

*Primary Examiner* — Kenneth B Lee, Jr.
(74) *Attorney, Agent, or Firm* — Hemisphere Law, PLLC; Zhigang Ma

(57) ABSTRACT

An array substrate, a manufacturing method thereof and a touch display panel are provided. A plurality of first touch electrodes in each row of a touch layer are electrically connected and a plurality of second touch electrodes in each column of a touch layer are electrically connected, the first touch electrodes in each row are connected to a first touch trace and the second touch electrodes in each column are connected to a second touch trace, the first touch trace and the second touch trace are connected to a touch chip to achieve the touch effect, the first touch electrodes in each row only be connected to one touch trace, and the second touch electrodes in each column only be connected to one touch trace to greatly reduce the number of touch traces, so that the width of the non-display area of the touch screen can be greatly reduced.

17 Claims, 3 Drawing Sheets

(51) Int. Cl.
    *G02F 1/1343*     (2006.01)
    *G02F 1/1335*     (2006.01)
    *G02F 1/1333*     (2006.01)
    *H01L 27/12*     (2006.01)
    *G06F 3/044*     (2006.01)
    *H01L 29/786*     (2006.01)

(52) U.S. Cl.
    CPC ........ *G02F 1/133512* (2013.01); *G06F 3/047* (2013.01); *G06F 3/0443* (2019.05); *G06F 3/0446* (2019.05); *G06F 3/04164* (2019.05); *H01L 27/1218* (2013.01); *H01L 27/1248* (2013.01); *H01L 29/78633* (2013.01); *G06F 2203/04103* (2013.01); *G06F 2203/04111* (2013.01)

(56) References Cited

FOREIGN PATENT DOCUMENTS

| | | |
|---|---|---|
| CN | 104866126 A | 8/2015 |
| CN | 104898892 A | 9/2015 |
| CN | 105742330 A | 7/2016 |
| CN | 205427390 U | 8/2016 |
| CN | 106325601 A | 1/2017 |
| CN | 106654067 A | 5/2017 |
| CN | 106951125 A | 7/2017 |
| KR | 1020140062341 A | 5/2014 |

\* cited by examiner

ARRAY SUBSTRATE, MANUFACTURING METHOD THEREOF AND TOUCH DISPLAY PANEL

RELATED APPLICATIONS

The present application is a National Phase of International Application Number PCT/CN2017/116962, filed Dec. 18, 2017, and claims the priority of China Application No. 201710937227.2, filed Sep. 30, 2017.

FIELD OF THE DISCLOSURE

The disclosure relates to a display technical field, and more particularly to an array substrate, a manufacturing method thereof and a touch display panel.

BACKGROUND

With the development of touch display technology, the touch display device has been put forward higher requirement and needs to be thinner. Therefore, in the prior art, the touch panel function is embedded in a liquid crystal pixel (in-cell) to achieve a thin touch display device. In the prior art, each touch electrode in the touch layer needs to be connected to the touch chip through a touch trace, however, each of the touch electrodes is connected to a touch trace, which requires a large number of touch traces. Such a large number of touch traces need to occupy a large trace area, which is contrary to the requirement that the width of the non-display area of the touch screen is required to be narrower at present.

SUMMARY

A technical problem to be solved by the disclosure is to provide an array substrate, a manufacturing method thereof and a touch display panel to greatly reduce the number of touch traces, so that the width of the non-display area of the touch screen can be greatly reduced.

The array substrate includes:
a base;
a thin film transistor, disposed on the base;
a planarization layer, covering the thin film transistor; and
a touch layer, disposed on a side of the planarization layer away from the thin film transistor, wherein the touch layer includes:
   a plurality of first touch electrodes, arranged in matrix; and
   a plurality of second touch electrodes, arranged in matrix;
   wherein the first touch electrodes and the second touch electrodes are disposed alternately, the first touch electrodes are insulating form the second touch electrodes, two adjacent first touch electrodes in each row are electrically connected by a connecting wire, the second touch electrodes in each column are electrically connected, and the connecting wire and a source/drain of the thin film transistor are in the same layer and obtained by the same process.

Wherein the first touch electrodes in each row are connected to a first touch trace, the second touch electrodes in each column are connected to a second touch trace, each first touch trace and each second touch trace are electrically connected to a touch chip.

Wherein each first touch trace is electrically connected to at least one of the thin film transistor, the thin film transistor electrically connected to each first touch trace are connected to a main wiring, and each main wiring is electrically connected to the touch chip.

Wherein the connecting wire and the touch layer are in different layers, and two adjacent first touch electrodes connected to the connecting wire via a through hole.

Wherein the connecting wire and the touch layer are made of metal material.

Wherein a second insulating layer and a pixel electrode are sequentially disposed on the touch layer, the pixel electrode is electrically connected to the source/drain of the thin film transistor via a through hole.

Wherein a common electrode layer and a first insulating layer are sequentially disposed between the planarization layer and the touch layer, the common electrode layer is disposed on the planarization layer, a light shielding layer and a buffer layer are sequentially disposed on the base, and the transistor is disposed on the buffer layer.

Wherein two adjacent second touch electrodes in each column are connected by a connecting portion, the connecting portion and the second touch electrodes are the same material and in the same layer, the connecting portion connects the second touch electrodes in each column to form a strip electrode, and the first touch electrodes are respectively located at two sides of the strip electrode.

The manufacturing method of an array substrate includes the following steps:
stacking up a light shielding layer and a buffer layer on a base sequentially, forming a thin film transistor on the buffer layer through patterning process, wherein the thin film transistor includes a semiconductor layer, a gate insulating layer, a gate, a third insulating layer, and a source/drain stacking up sequentially, the source/drain are electrically connected to the semiconductor layer via a through hole, and forming a connecting wire when forming the source/drain through patterning process;

forming a planarization layer, a common electrode layer and a first insulating layer on the thin film transistor sequentially;

forming a touch layer on the first insulating layer through patterning process, wherein the touch layer includes a plurality of first touch electrodes arranged in matrix and a plurality of second touch electrodes arranged in matrix, the first touch electrodes and the second touch electrodes are disposed alternately, the first touch electrodes are insulating form the second touch electrodes, two adjacent first touch electrodes in each row are electrically connected by a connecting wire, the second touch electrodes in each column are electrically connected;

forming a second insulating layer and a pixel electrode on the touch layer sequentially through patterning process to make the pixel electrode electrically connect to the source/drain via a through hole.

The touch display panel includes a color filter substrate and the above-mentioned array substrate, the color filter substrate disposed opposite to the array substrate, wherein the color filter substrate includes a black matrix, a projection of the black matrix on the touch layer covers the first touch electrodes and the second touch electrodes.

The array substrate provided by the disclosure. A plurality of first touch electrodes in each row of a touch layer are electrically connected and a plurality of second touch electrodes in each column of a touch layer are electrically connected, the first touch electrodes in each row are connected to a first touch trace and the second touch electrodes in each column are connected to a second touch trace, the first touch trace and the second touch trace are connected to a touch chip to achieve the touch function, the first touch electrodes in each row only be connected to one touch trace, and the second touch electrodes in each column only be connected to one touch trace to greatly reduce the number of touch traces, so that the width of the non-display area of the touch screen can be greatly reduced. The connecting wire and a source/drain of the thin film transistor are in the same layer and obtained by the same process, so additional process is not required, and the manufacturing cost could be decreased.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts.

DETAILED DESCRIPTION OF PREFERRED EMBODIMENTS

In order to illustrate a technical solution according to embodiments of the disclosure more clearly, drawings to be used in the description of the embodiments will be briefly set forth in the following. It is obvious that the drawings in the following description are only related to some embodiments of the disclosure. Those ordinarily skilled in the art may obtain other embodiments according to these drawings, without any inventive work.

Figure 1:
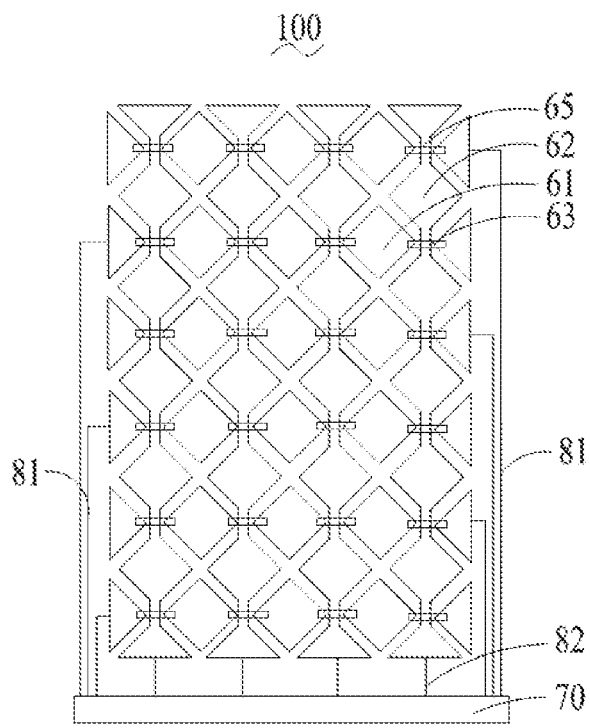
FIG. 1 is a connection schematic view of a touch screen and a touch chip according to an embodiment of the disclosure.
Figure 2:
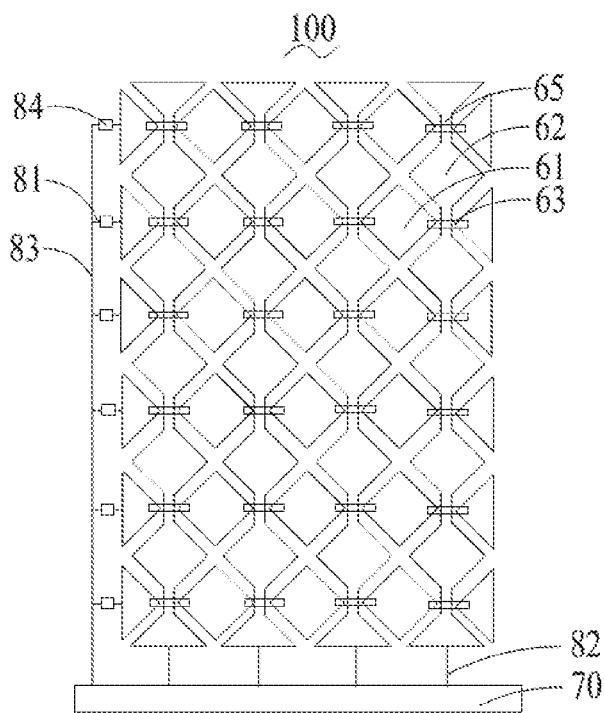
FIG. 2 is a connection schematic view of a touch screen and a touch chip according to an embodiment of the disclosure.
Figure 3:
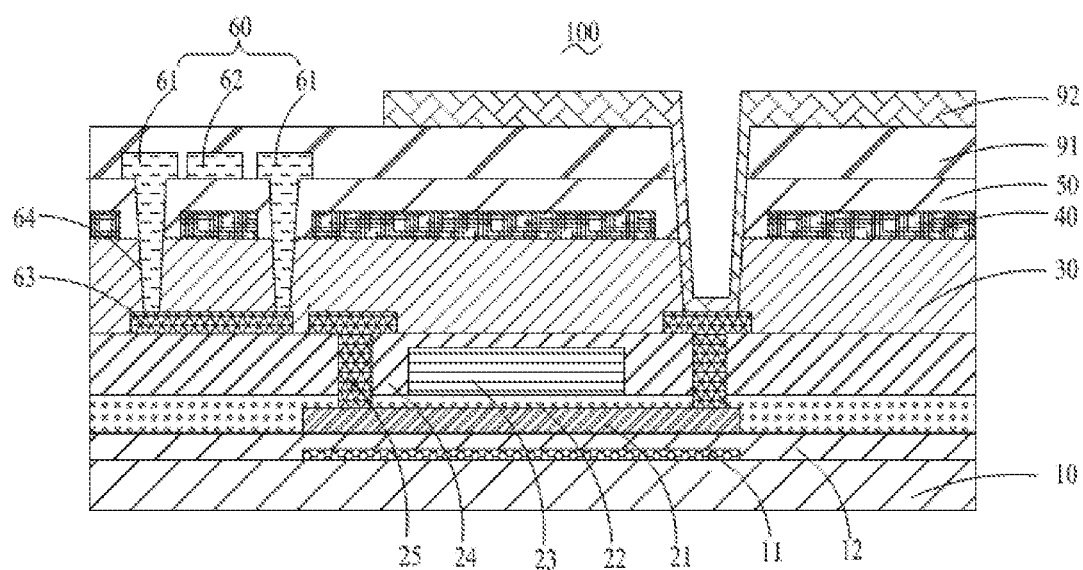
FIG. 3 is a section schematic view of the array substrate in FIG. 1.

Please refer to FIG. 1 and FIG. 3, the disclosure provides an array substrate 100. The array substrate 100 includes a base 10, a thin film transistor disposed on the base 10, a planarization layer 30 covering the thin film transistor. A touch layer 60 disposed on a side of the planarization layer 30 away from the thin film transistor. The touch layer 60 includes a plurality of touch electrodes, the touch electrodes are electrically connected to a touch chip 70 to achieve the touch function of the touch layer 60 via the touch layer 60 and the touch chip 70. The array substrate 100 includes a display area and a non-display area connected to and surrounding the display area.

In this disclosure, the types of the thin film transistor are many, such as amorphous silicon thin film transistor, polycrystalline silicon thin film transistor, organic thin film transistor, oxide thin film transistor and so on. In this embodiment, the thin film transistor is low-temperature polycrystalline silicon thin film transistor. The thin film transistor includes a semiconductor layer 21, a gate insulating layer 22, a gate 23, a third insulating layer 24, and a source/drain layer 25, the source/drain layer 25 includes a source and a drain spaced apart from each other. The source and the drain are electrically connected to the semiconductor layer 21 via a through hole. The touch layer 60 includes a plurality of first touch electrodes 61 arranged in matrix and a plurality of second touch electrodes 62 arranged in matrix. In this disclosure, the first touch electrodes 61 and the second touch electrodes 62 are formed through the same process. Specifically, by forming a metal material layer the first insulating layer 50, the first touch electrodes 61 and the second touch electrodes 62 are simultaneously formed by patterning. The first touch electrodes 61 could be transmission electrodes (Tx)/receiving electrodes (Rx), the second electrodes 61 could be transmission electrodes (Tx)/receiving electrodes (Rx). In this embodiment, the first touch electrodes 61 and the second touch electrodes 62 are diamond-shaped. It should be understood that the first touch electrodes 61 and the second touch electrodes 62 could be other shape, such as square, rectangular and so on, the shape of the first touch electrodes 61 and the second touch electrodes 62 could be the same or different. The first touch electrodes 61 and the second touch electrodes 62 are disposed alternately, the first touch electrodes 61 are insulating form the second touch electrodes 62. The first touch electrodes 61, the second touch electrodes 62 adjacent thereto, and the insulating layer therebetween form a capacitor. When an arbitrary position of the touch layer 60 is touched, the capacitance of the touch position is changed, and the touch position is obtained by detecting the change of the capacitance to achieve the touch function.

In this disclosure, the first touch electrodes 61 in each row are electrically connected, and the second touch electrodes 62 in each column are electrically connected. It should be understood that the first touch electrodes 61 in each row may be electrically connected to each other, and the second touch electrodes 62 in each row may be electrically connected depending on the direction of the array substrate 100.

Specifically, two adjacent first touch electrodes 61 in each row are electrically connected by a connecting wire 63 to complete the electric connection between the first touch electrodes 61 in each row. The connecting wire 63 and the touch layer 60 are not in the same layer, two adjacent first touch electrodes 61 in each row are electrically connected by the connecting wire 63. The connecting wire 63 is in the source/drain layer 25 and is obtained by the same process of the source and the drain. The material of the first touch electrodes 61, the second touch electrodes 62 and the connecting wire 63 are the same, in this embodiment, the connecting wire 63, the first touch electrodes 61 and the second touch electrodes 62 are made of metal material. Compared with the prior art, both the first touch electrodes 61 and the second touch electrodes 62 are made of metal material, and the connection wire is ITO material same as the common electrode layer, in the disclosure, the contact resistance between the connection wire in the first touch electrodes 61 and the second touch electrodes 62 is smaller than that in the prior art so as to achieve a better touch effect. According to the actual test, in the disclosure, the contact resistance between the connecting wire 63 and the first touch electrodes 61 and the second touch electrodes 62 is 0.61Ω. In the prior art, the contact resistance between the connection wire formed by ITO material and the first touch electrodes 61 and the second touch electrodes 62 is 28.52Ω.

Two adjacent second touch electrodes 62 in each column are connected by a connecting portion 65, the connecting portion 65 and the second touch electrodes 62 are the same material and in the same layer, that is, the connecting portion 65 and the second touch electrodes 62 are formed by the same process, so the connecting portion 65 connects the second touch electrodes 62 in each column to form a strip electrode, and the first touch electrodes 61 are respectively located at two sides of the strip electrode. In this embodiment, since both the first touch electrodes 61 and the second touch electrodes 62 are diamond-shaped, the two long sides of the stripe electrode formed by connecting the second touch electrodes 62 in each row are concave-convex wavy structure. In other embodiment of the disclosure, the first touch electrodes 61 and the second touch electrodes 62 are square or rectangular, and the stripe electrode formed by connecting the second touch electrodes 62 in each row may be rectangular, that is, two long sides of the stripe electrode are straight lines. It should be understood that according to different shapes of the second touch electrodes 62, the stripe electrode formed by connecting the second touch electrodes 62 may have other shape, such as the long side is arc shape.

The first touch electrodes 61 and the second touch electrodes 62 are connected to the touch chip 70 by the touch traces. The touch trace includes a first touch trace 81 and a second touch trace 82. In this embodiment, the first touch electrodes 61 in each row are connected to the first touch trace 81, the second touch electrodes 62 in each column are connected to the second touch trace 82. In this disclosure, by electrically connecting the first touch electrodes 61 in each row, and electrically connecting the second touch electrodes 62 in each column, then the first touch electrodes 61 in each row are connected to the first touch trace 81, and the second touch electrodes 62 in each column are connected to the second touch trace 82. So that while achieving the touch function, the first touch electrodes 61 in each row only need to be connected to a touch trace, and the second touch electrodes 62 only need to be connected to a touch trace, so the number of touch traces is reduced to further reduce the width of the non-display area of the touch screen.

In this disclosure, the first touch electrodes 61 and the second touch electrodes 62 are connected to the touch chip 70 by the touch traces. Specifically, a plurality of connecting terminals 71 are disposed on the touch chip 70. In this embodiment, each touch trace is connected to one of the connecting terminals 71 of the touch chip 70. Since the number of the touch traces is greatly reduced, the number of the connecting terminals on the touch chip 70 in the disclosure may be correspondingly small, so that the size of the touch chip 70 can be reduced or the area of the connecting terminal can be increased to reduce the difficulty in manufacturing the connecting terminal and further improve the production yield of the touch chip 70. In this disclosure, the touch chip 70 may be disposed on the array substrate 100 and located in a non-display area of the array substrate 100 so as to avoid the influence on the display effect of the touch display panel including the array substrate 100. Alternatively, the touch chip 70 is mounted on a flexible circuit board (PFC board) by chip-on-film (COF) technology so that the width of the non-display area including the array substrate 100 can be further reduced. In this embodiment, the touch chip 70 is mounted on a flexible substrate circuit (PFC board) by the COF technology.

Please refer to FIG. 3, the disclosure further provides another embodiment of the array substrate 100, the difference between this embodiment and the above-mentioned embodiment is: the array substrate 100 further includes a plurality of thin film transistors 84, each first touch trace 81 is electrically connected to at least one of the thin film transistor 84, and each thin film transistor 84 connected to each first touch trace 81 is electrically connected to the touch chip. That is, the first touch electrodes 61 in each row are electrically connected to the touch chip 70 by the thin film transistor 84. In this embodiment, each first touch trace 81 is electrically connected to one of the thin film transistor 84. The thin film transistor 84 is located on either side of a row of the first touch electrodes 61 corresponding to the thin film transistor 84, and the thin film transistors 84 are connected to a main wiring 83 and then connected to the touch chip 70 through the main wiring 83 so as to further reduce the number of touch traces in the non-display area of the array substrate 100 and to further reduce the width of the non-display area due to the occupied area of the transistor is small. It can be understood that, in other embodiments, each of the first touch traces 81 may be electrically connected with two thin film transistors 84. The two thin film transistors 84 are disposed on two sides of each of the first touch traces 81 to transmit the touch signals to the touch electrodes in each row by the two thin film transistors 84 so as to improve the response speed of the touch layer 60.

The array substrate further includes a second insulating layer 91 covering the touch layer 60 and a pixel electrode 92 disposed on the second insulating layer 91. The pixel electrode 92 is electrically connected to the source/drain of the thin film transistor on the base 10 via a through hole. In this embodiment, the liquid crystal display panel formed by the array substrate 100 is an FFS type liquid crystal display panel. That is, the common electrode layer and the pixel electrode of the liquid crystal display panel are all located on the array substrate 100. Specifically, in this embodiment, a common electrode layer 40 and a first insulating layer 50 are sequentially disposed between the planarization layer 30 and the touch layer 60, the common electrode layer 40 is disposed on the planarization layer 30. It can be understood that in another embodiment of the disclosure, if the liquid crystal display panel made of the array substrate is a VA type liquid crystal display panel, the common electrode layer 40 and the first insulating layer 50 may not be disposed on the array substrate 100. Furthermore, in this embodiment, a light shielding layer 11 and a buffer layer 12 are sequentially disposed on the base 10 so as to ensure the close combination of the thin film transistor and the base 10 and ensure the effective operation of the thin film transistor.

In this disclosure, the first touch electrodes 61 in each row are electrically connected and the second touch electrodes 62 in each column are electrically connected, the first touch electrodes 61 in each row only need to be connected to a first touch trace 81 and the second touch electrodes in each column only need to be connected to a second touch trace 82 to achieve the touch function and greatly reduce the number of touch traces, so that the width of the non-display area of the touch screen can be greatly reduced. Furthermore, the first touch electrodes 61 in each row are electrically connected to the touch chip 70 through the thin film transistors 84, so the number of touch traces can be further reduced to further reduce the width of the non-display area of the touch screen. In addition, due to the number reduction of the touch traces, the size of the touch chip 70 can be reduced, or the size of the connecting terminal of the touch chip 70 can be increased to improve the yield of the touch chip 70. Moreover, in the disclosure, the connecting lines 63 connecting the two adjacent first touch electrodes 61 are metal materials, compared with the prior art, the first touch electrode 61 is a metal material, and the connecting wire is an ITO material, the contact resistance between the connecting wire in the disclosure and the first touch electrode 61 and the second touch electrode 62 is smaller than that in the prior art so as to achieve a better touch effect. In addition, the connecting wire 63 is in the same layer as the source/drain layer 25 and is formed by the same process as the source/drain layer 25. Therefore, new process of the array substrate 100 does not need to be added.

Figure 4:
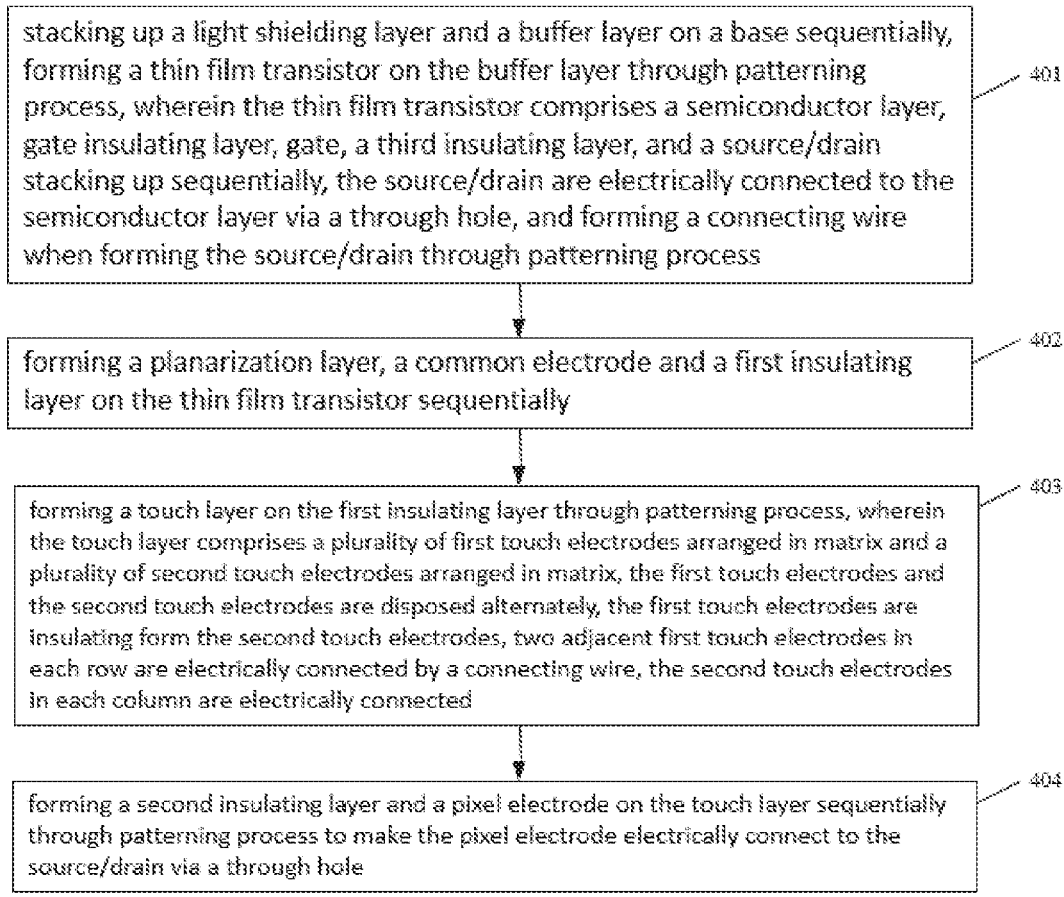
FIG. 4 is a flow chart diagram of a manufacturing method of an array substrate according to an embodiment of the disclosure.

Please refer to FIG. 4, the disclosure further provides a manufacturing method of the array substrate 100, including the following steps:

Step 401, stacking up a light shielding layer and a buffer layer on a base 10 sequentially, forming a thin film transistor on the buffer layer through patterning process, wherein the thin film transistor includes a semiconductor layer 21, a gate insulating layer 22, a gate 23, a third insulating layer 24, and a source/drain layer 25 stacking up sequentially, the source/drain layer 25 includes a source and a drain spaced apart from each other. In addition, in the disclosure, the source/drain layer 25 is formed to further include a connection wire 63 in the same layer as the source and the drain, and obtained through the same mask by exposure, development, etching, that is obtained with the source and drain by the same process, so the connecting wire 63 can be formed without increasing the manufacturing process, so as to save the manufacturing cost.

Step 402, forming a planarization layer 30, a common electrode layer 40 and a first insulating layer 50 on the thin film transistor sequentially.

Step 403, forming a touch layer 60 on the first insulating layer 50 through patterning process, wherein the touch layer 60 comprises a plurality of first touch electrodes 61 arranged in matrix and a plurality of second touch electrodes 62 arranged in matrix, the first touch electrodes 61 and the second touch electrodes 62 are disposed alternately, the first touch electrodes 61 are insulating form the second touch electrodes 62, the first touch electrodes 61 in each row are electrically connected, the second touch electrodes 62 in each row are electrically connected. Specifically, two adjacent first touch electrodes 61 are connected to the connecting wire 63 via the through hole so that two adjacent first touch electrodes 61 are electrically connected, and the first touch electrodes 61 in each row are electrically connected in the same manner. In the disclosure, the second touch electrodes 62 in each column are connected by the connecting portion 65. In this embodiment, when the touch layer 60 is formed through a patterning process, the connecting portion 65 is formed simultaneously with the first touch electrodes 61 and the second touch electrodes 62. Specifically, forming a touch material layer on the first insulating layer 50 and then patterning the touch material layer so as to obtain a touch layer 60 including the connecting portion 65, the first touch electrodes 61, and the second electrodes 62.

Step 404, forming a second insulating layer 91 and a pixel electrode 92 on the touch layer 60 sequentially through patterning process to make the pixel electrode 92 electrically connect to the connecting layer 21 via a through hole, the pixel electrode 92 is electrically connected to the source or the drain of the thin film transistor through the connecting layer 21 to avoid the problem of poor contact between the pixel electrode 92 and the connecting layer 21 possibly caused by the excessive through hole.

According to the manufacturing method of the array substrate 100 provided by the disclosure, there is no need to increase the manufacturing process when manufacturing the array substrate 100, so the production cost could be reduced.

Figure 5:
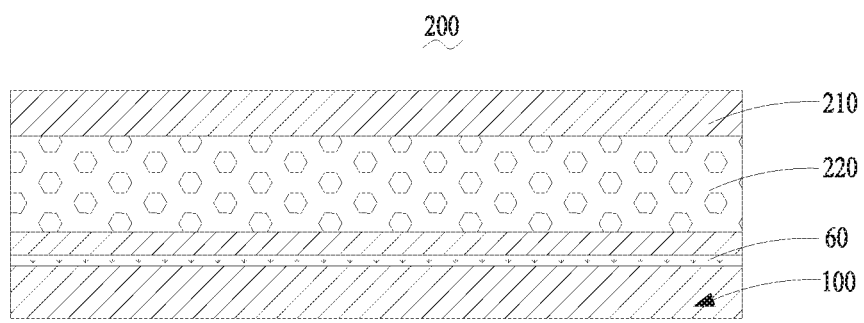
FIG. 5 is a structural schematic view of a touch display panel according to an embodiment of the disclosure.

Please refer to FIG. 5, the disclosure further provides a touch display panel 200. The touch display panel 200 includes a color filter substrate 210 and the above-mentioned array substrate 100, the color filter substrate 210 disposed opposite to the array substrate 100, and a surface of the base 10 the thin film transistor disposed thereon faces the color filter substrate 210. A liquid crystal layer 220 disposed between the array substrate 100 and the color filter substrate 210. In this disclosure, the color filter substrate 210 includes a black matrix, a projection of the black matrix on the touch layer covers the first touch electrodes 61 and the second touch electrodes 62. Specifically, in this embodiment, the black matrix includes a plurality of first frame lines arranged in parallel and a plurality of second frame lines arranged in parallel crossing the first frame lines. Two adjacent rows of first frame lines and two adjacent second frame lines form a pixel region, and the pixel regions are filled with photoresist of different colors to realize the display function of the touch display panel 200. The projection of each first frame line on the touch layer in each row covers a row of the first electrodes 61 and the projection of each second frame line on the touch layer covers a row of the second electrodes 62, so that the first touch electrodes 61 and the second touch electrodes 62 of the touch layer 60 do not affect the display effect of the touch display panel 200. In the touch display panel 200 of the disclosure, the touch layer 60 is embedded in the array substrate 100, compared with the conventional method that the touch substrate including the touch layer 60 is attached to the surface of the display panel, the thickness of the touch substrate can be reduced, so the thickness of the touch display panel can be reduced.

The contents are detailed description of the disclosure in conjunction with specific preferred embodiments and concrete embodiments of the disclosure are not limited to this description. For the person skilled in the art of the disclosure, without departing from the concept of the disclosure, simple deductions or substitutions can be made and should be included in the protection scope of the application.

What is claimed is:

1. An array substrate, comprising:
a base;
a thin film transistor, disposed on the base;
a planarization layer, covering the thin film transistor; and
a touch layer, disposed on a side of the planarization layer away from the thin film transistor, wherein the touch layer comprises:
a plurality of first touch electrodes, arranged in matrix; and
a plurality of second touch electrodes, arranged in matrix;
wherein the first touch electrodes and the second touch electrodes are disposed alternately, the first touch electrodes are insulating form the second touch electrodes, two adjacent first touch electrodes in each row are electrically connected by a connecting wire and the connecting wire is disposed on a side of the planarization layer facing the thin film transistor, the second touch electrodes in each column are electrically connected, and the connecting wire and a source/drain of the thin film transistor are in the same layer and obtained by the same process.

2. The array substrate according to claim 1, wherein the first touch electrodes in each row are connected to a first touch trace, the second touch electrodes in each column are connected to a second touch trace, each first touch trace and each second touch trace are electrically connected to a touch chip.

3. The array substrate according to claim 1, wherein each first touch trace is electrically connected to at least one of the thin film transistor, the thin film transistor electrically connected to each first touch trace are connected to a main wiring, and each main wiring is electrically connected to the touch chip.

4. The array substrate according to claim 1, wherein the connecting wire and the touch layer are in different layers, and two adjacent first touch electrodes connected to the connecting wire via a through hole.

5. The array substrate according to claim 1, wherein the connecting wire and the touch layer are made of metal material.

6. The array substrate according to claim 1, wherein a second insulating layer and a pixel electrode are sequentially disposed on the touch layer, the pixel electrode is electrically connected to the source/drain of the thin film transistor via a through hole.

7. The array substrate according to claim 6, wherein a common electrode layer and a first insulating layer are sequentially disposed between the planarization layer and the touch layer, the common electrode layer is disposed on the planarization layer, a light shielding layer and a buffer layer are sequentially disposed on the base, and the transistor is disposed on the buffer layer.

8. The array substrate according to claim 1, wherein two adjacent second touch electrodes in each column are connected by a connecting portion, the connecting portion and the second touch electrodes are the same material and in the same layer, the connecting portion connects the second touch electrodes in each column to form a strip electrode, and the first touch electrodes are respectively located at two sides of the strip electrode.

9. A manufacturing method of an array substrate, comprising the following steps:
stacking up a light shielding layer and a buffer layer on a base sequentially, forming a thin film transistor on the buffer layer by patterning, wherein the thin film transistor comprises a semiconductor layer, a gate insulating layer, a gate, a third insulating layer, and a source/drain stacking up sequentially, the source/drain are electrically connected to the semiconductor layer via a through hole, and forming a connecting wire when forming the source/drain by patterning;
forming a planarization layer, a common electrode layer and a first insulating layer on the thin film transistor sequentially;
forming a touch layer on the first insulating layer by patterning, wherein the touch layer comprises a plurality of first touch electrodes arranged in matrix and a plurality of second touch electrodes arranged in matrix, the first touch electrodes and the second touch electrodes are disposed alternately, the first touch electrodes are insulating form the second touch electrodes, two adjacent first touch electrodes in each row are electrically connected by a connecting wire, the second touch electrodes in each column are electrically connected, wherein the connecting wire is disposed on a side of the planarization layer facing the thin film transistor;
forming a second insulating layer and a pixel electrode on the touch layer sequentially by patterning to make the pixel electrode electrically connect to the source/drain via a through hole.

10. A touch display panel, comprising a color filter substrate and an array substrate, the color filter substrate disposed opposite to the array substrate, wherein the color filter substrate comprises a black matrix, a projection of the black matrix on a touch layer covers a plurality of first touch electrodes and a plurality of second touch electrodes, the array substrate comprises a base, a thin film transistor disposed on the base, a planarization layer covering the thin film transistor, and the touch layer disposed on a side of the planarization layer away from the thin film transistor, wherein the touch layer comprises:
the first touch electrodes, arranged in matrix; and
the second touch electrodes, arranged in matrix;
wherein the first touch electrodes and the second touch electrodes are disposed alternately, the first touch electrodes are insulating form the second touch electrodes, two adjacent first touch electrodes in each row are electrically connected by a connecting wire and the connecting wire is disposed on a side of the planarization layer facing the thin film transistor, the second touch electrodes in each column are electrically connected, and the connecting wire and a source/drain of the thin film transistor are in the same layer and obtained by the same process.

11. The touch display panel according to claim 10, wherein the first touch electrodes in each row are connected to a first touch trace, the second touch electrodes in each column are connected to a second touch trace, each first touch trace and each second touch trace are electrically connected to a touch chip.

12. The touch display panel according to claim 10, wherein each first touch trace is electrically connected to at least one of the thin film transistor, the thin film transistor electrically connected to each first touch trace are connected to a main wiring, and each main wiring is electrically connected to the touch chip.

13. The touch display panel according to claim 10, wherein the connecting wire and the touch layer are in different layers, and two adjacent first touch electrodes connected to the connecting wire via a through hole.

14. The touch display panel according to claim 10, wherein the connecting wire and the touch layer are made of metal material.

15. The touch display panel according to claim 10, wherein a second insulating layer and a pixel electrode are sequentially disposed on the touch layer, the pixel electrode is electrically connected to the source/drain of the thin film transistor via a through hole.

16. The touch display panel according to claim 15, wherein a common electrode layer and a first insulating layer are sequentially disposed between the planarization layer and the touch layer, the common electrode layer is disposed on the planarization layer, a light shielding layer and a buffer layer are sequentially disposed on the base, and the transistor is disposed on the buffer layer.

17. The touch display panel according to claim 10, wherein two adjacent second touch electrodes in each column are connected by a connecting portion, the connecting portion and the second touch electrodes are the same material and in the same layer, the connecting portion connects the second touch electrodes in each column to form a strip electrode, and the first touch electrodes are respectively located at two sides of the strip electrode.

* * * * *